United States Patent [19]
Fuchigami et al.

[11] Patent Number: 5,865,639
[45] Date of Patent: Feb. 2, 1999

[54] BURN-IN TEST SOCKET APPARATUS

[75] Inventors: Masahiro Fuchigami, Norton; Salvatore P. Rizzo, Attleboro, both of Mass.

[73] Assignee: Texas Instruments Incorporated, Dallas, Tex.

[21] Appl. No.: 890,272

[22] Filed: Jul. 9, 1997

Related U.S. Application Data

[63] Continuation-in-part of Ser. No. 668,663, Jun. 25, 1996, abandoned.

[51] Int. Cl.[6] .................................................. H01R 13/62
[52] U.S. Cl. .......................... 439/330; 439/266; 439/487; 361/709
[58] Field of Search ..................................... 439/330, 331, 439/264, 266, 487, 71, 72, 73, 70; 361/709

[56] References Cited

U.S. PATENT DOCUMENTS

| | | | |
|---|---|---|---|
| 5,106,309 | 4/1992 | Matsuoka et al. | 439/71 |
| 5,320,550 | 6/1994 | Uratsuji et al. | 439/266 |
| 5,360,348 | 11/1994 | Johnson | 439/487 |
| 5,376,010 | 12/1994 | Petersen | 439/71 |
| 5,389,819 | 2/1995 | Matsuoka | 439/71 |
| 5,470,247 | 11/1995 | Fuchigami | 439/264 |

OTHER PUBLICATIONS

U.S. Patent Application Serial No. 08/592,146 filed Jan. 26, 1996 entitled A Test Score—based on Japanese Patent Application No. 7(1995)–43423 filed Feb. 8, 1995.

*Primary Examiner*—Paula Bradley
*Assistant Examiner*—Tho D. Ta
*Attorney, Agent, or Firm*—Russell E. Baumann; Richard L. Donaldson; Rene' E. Grossman

[57] ABSTRACT

Socket apparatus (10) particularly adapted for use of burn-in tests of IC components having a large number of contact points on the bottom surface thereof has a cover frame (16) and adapter plate (22) movably mounted on a base (16). A latch assembly (30) is pivotably mounted on the base (12) at each side thereof and is linked to the cover frame so that when the cover frame is moved downwardly toward the base against the bias of spring members (20) each latch member (30a) is pivoted away from the seating surface allowing an IC component to be inserted into the socket or removed from the socket. When the cover frame (16) is allowed to return to its normal, at-rest position, each latch member pivots toward the base member to a position overlying the seating surface and engages an IC component received on the seating surface and transfers a force through the IC component to the adapter plate thereby lowering the adapter plate and exposing contact elements (14) so that they engage respective contact points of the IC component. In a modified embodiment (10') heat sink assemblies (40) are mounted for movement with two opposing latch assemblies (30). Each heat sink assembly comprises a head (42) movable between inner and outer positions so that the head can be brought into engagement with an IC component with a selected level of spring force for optimum thermal coupling.

14 Claims, 7 Drawing Sheets

BURN-IN TEST SOCKET APPARATUS

CROSS REFERENCE TO RELATED APPLICATION

This is a continuation-in-part of application Ser. No. 08/668,663, filed Jun. 25, 1996 now abandoned.

FIELD OF THE INVENTION

This invention relates generally to integrated circuit (IC) components and more particularly to socket apparatus for use in testing such IC components.

BACKGROUND OF THE INVENTION

In conducting a heat resistance test of an IC component, called a burn-in test, it is conventional to place the IC component in a socket which, in turn, is connected to a circuit substrate and then to place the substrate into a heating device so that the temperature of the IC component can be raised to a selected level to conduct the test to thereby determine whether the IC component meets required specifications.

Typical prior art sockets used for this purpose comprise a base member formed of electrically insulative material in which an electrical contact element is mounted for each lead of the IC component to be tested. The contact elements are arranged in a selected pattern relative to an IC component mounting seat provided in the base and have movable contact portions adapted to move into and out of electrical engagement with respective leads of the IC component. Typically, a cover member is movably mounted on the base and is provided with structure which allows the contact elements to move away from the IC component mounting seat when the cover member is in an open position to allow placement of an IC component in and removal of the component from the socket. When the cover member is moved to a closed position the contact elements are caused to move into electrical engagement with the respective leads of the IC component.

One type of prior art socket comprises a cover member which is vertically movable in which the IC component is inserted or removed from the socket by pushing the cover member toward the base with the cover member camming an extension of each spring type contact element so that the contact making portion of each respective contact element is pivoted or swung away from the IC component's leads. When the cover member is allowed to return to a position away from the base under the influence of spring members, the contact making portion of the contact elements are allowed to move into engagement with the respective leads of an IC component received in the socket. This type of socket generally has certain limitations including an undesirable increase of inductance in the circuit and concomitant interference with adjacent contacts due to the particular complex configuration of the contact elements required to achieve the pivotal motion. Further, the structure is best suited for use with IC components which have only a single row of leads on any given side of the IC component.

Another type of prior art socket comprises a cover member which is pivotably mounted to the base with the cover held in a closed position by means of a latch. Leads of an IC component placed on the seat of the base are engaged by respective contact elements cammed by the cover as it is placed in the closed position. This type of socket, however, is not conducive to automation due to the rotational movement of the cover.

A particularly advantageous socket is shown in coassigned U.S. Pat. No. 5,470,247 in which a cover member is mounted for vertical motion on a base with latch members interconnected between the cover member and the base. The latch members are movable toward and away from movable spring contact elements mounted in the base in dependence upon the position of the cover member. The leads of an IC component are placed on top of respective movable spring contact elements when the cover member is in a pushed down position with the latch members pivoted away from the IC component seat. When the cover member is allowed to move vertically away from the base under the influence of spring members, the latch members are pivoted into engagement with the upper surface of the lead members of the IC component moving the lead members along with the movable spring contact elements downwardly a selected distance against the bias of the movable spring contact elements to provide a selected contact force.

As IC components become ever more dense, the number of electrical input and output connections required for the components increase. In order to accommodate significantly increased numbers of such electrical connections certain IC components are provided with a dense array of contact points disposed on the bottom surface of the components in place of conventional leads extending outwardly from sides of the components.

SUMMARY OF THE INVENTION

It is an object of the invention to provide burn-in test sockets which can be used with IC components described above having a dense array of contact points disposed on the bottom surface thereof. Another object of the invention is the provision of burn-in test sockets which overcome the prior art limitations noted above. Yet another object is the provision of a socket capable of accurately positioning contact points on a surface of an IC component with contact elements of the socket, for engaging the contact points with a selected amount of contact force, and for placing a heat sink in thermal coupling with the IC component during testing thereof which does not interfere with loading and unloading of the IC component.

Briefly, in accordance with the invention, an adapter plate is movably mounted on a base and spring biased toward an upper position in a direction away from the base. A plurality of elongated contact elements are mounted in the base each having a contact portion at a free distal end received in a respective aperture extending through the bottom wall of the adapter plate. A cover frame defining an opening or window is mounted on the base and is vertically movable between a spring biased upper, at-rest position away from the base and an actuated lower position adjacent to the base against the spring bias. The adapter plate, formed with IC component guide surfaces to guide an IC component placed over the adapter plate to an IC component seating surface on the adapter plate, is disposed within the window of the cover frame. A respective latch member is mounted on the base at each side for rotational movement and is linked to the cover so that the latch members move from a first position overlying the IC component seating surface of the adapter plate when the cover member is in the upper position to a second position pivoted away from the seating surface when the cover frame is in the lower actuated position to allow placement or loading of an IC component on and removal or unloading of the IC component from the seating surface. The latch members are provided with a force applying surface which is spaced from the seating surface of the adapter plate, when the latch members overlie the seating surface, a distance less than the thickness of a marginal portion of an IC component to be disposed on the seating surface and aligned with a respective latch member. When an IC component is placed on the seating surface of the adapter plate and the cover frame is allowed to resume its at-rest upper position, the latch members will transmit a force through the IC component to push the adapter plate downwardly and thereby bring the contact points disposed on the bottom surface of the IC component into engagement with a selected contact force with the contact portions of the free distal ends of the respective elongated contact elements which, in the lowered position of the adapter plate, project out of the apertures in the bottom wall thereof. A respective heat sink member is mounted for movement with each of two opposed latch members between an operational position overlying the adapter plate when the latch members are in the first position and a loading and unloading position removed from the adapter plate when the latch members are in the second position. The heat sink members are effectively coupled to links controlling the movement of the latch members to provide a suitable opening for IC component access when in the loading and unloading position. The heat sink members are movably mounted at the end of pivotally mounted legs between a spring biased outer position and an inner position against the bias of the spring. An IC component loaded in the socket will be engaged by the heat sink members, biasing the heat sink toward the inner position in optimum heat coupling with a selected spring force.

DESCRIPTION OF PREFERRED EMBODIMENT

Figure 1:
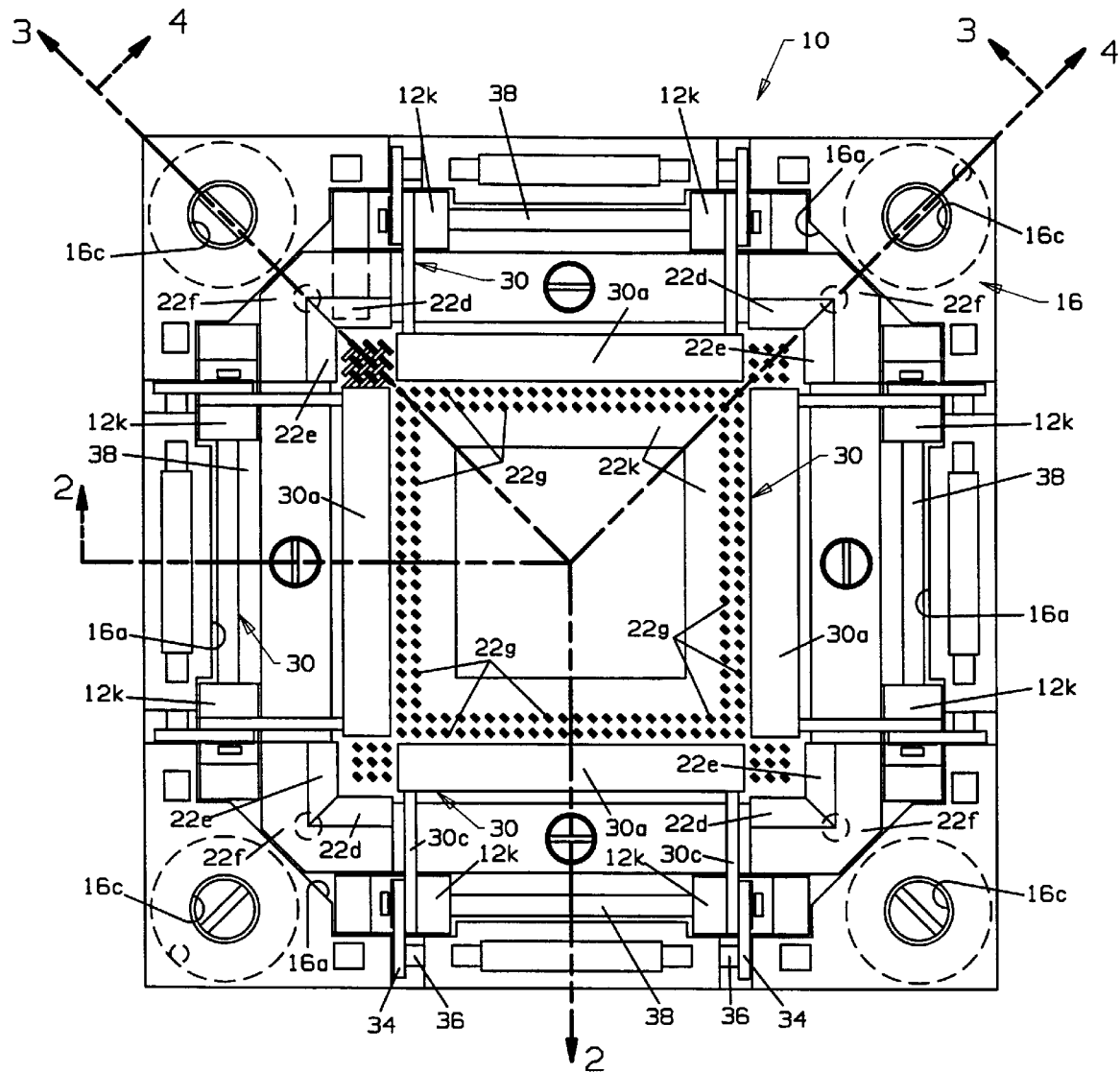
FIG. 1 is a top plan view of a socket made in accordance with the invention.
Figure 2:
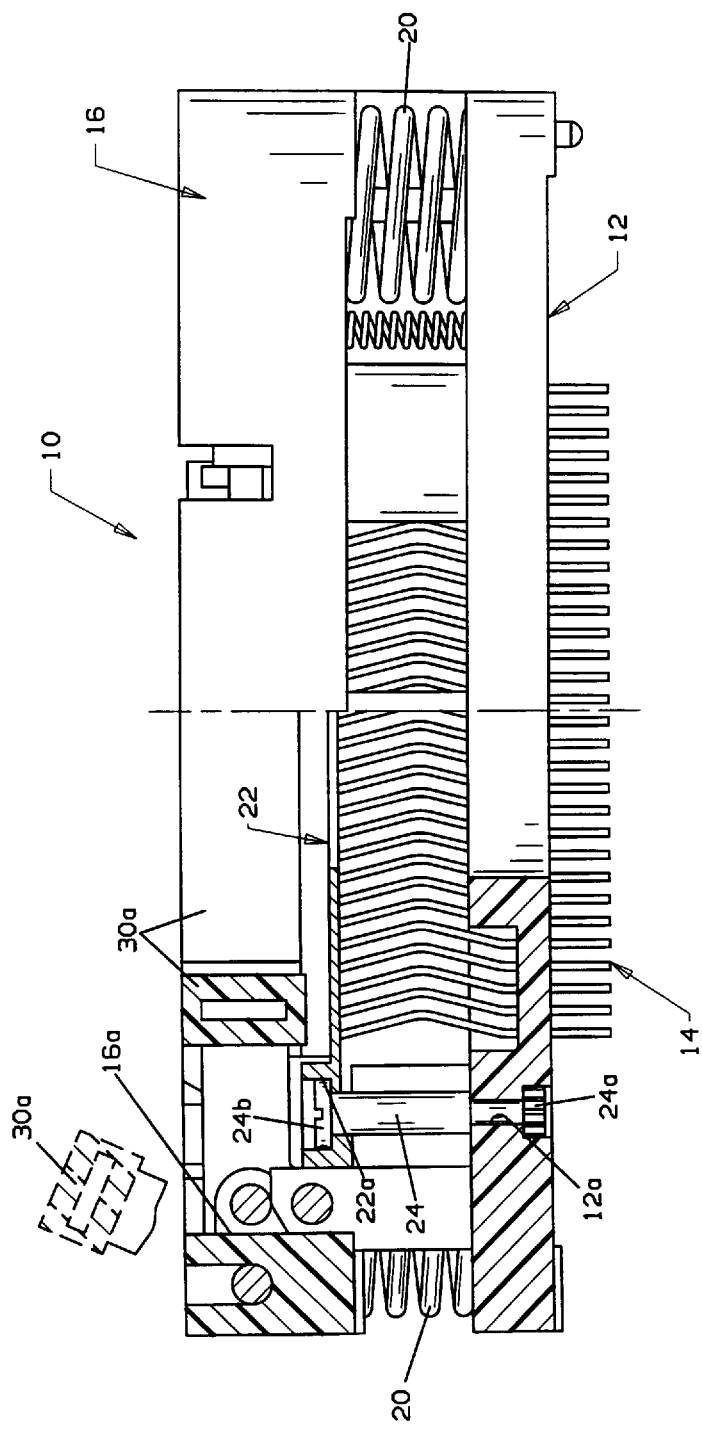
FIG. 2 is a front elevational view of the FIG. 1 socket with the left hand half shown in cross section along the lines 2—2 of FIG. 1.

Socket 10, made in accordance with the invention, comprises a base 12 of a selected configuration such as a square formed of suitable moldable plastic material in which electrical contact elements 14 are mounted for electrical connection with respective contact locations or points of an integrated circuit (IC) component to be mounted in the socket for testing purposes. Contact elements 14, in turn, project through the base for connection to a conventional circuit board, not shown, for use with the burn-in test equipment.

A cover frame 16, formed of suitable moldable plastic material and having a centrally located opening or window 16a providing space for movable latch members to be described below and for reception of an IC component into the socket and removal from the socket, is mounted on base 12 for vertical movement toward and away from the base. Cover frame 16 is formed with a bore 16b and counterbore 16c at each corner (see FIGS. 1, 3 and 4) with surface 16b therebetween forming a stop surface. A screw 18 is received through each bore 16b and through an aligned bore 12a in base 12 and is suitably secured as by a splined nut 18b received in counterbore 12b. Annular grooves 16e in the lower surface of cover frame 16 circumscribing each bore 16b and 12c in the upper surface of base 12 circumscribing each bore 12a, form seats for compression springs 20 which bias the cover frame upwardly, away from base 12 in a vertical direction with motion of the cover frame being limited by engagement of stop surface 16d with head 18c of respective screws 18.

Figure 7:
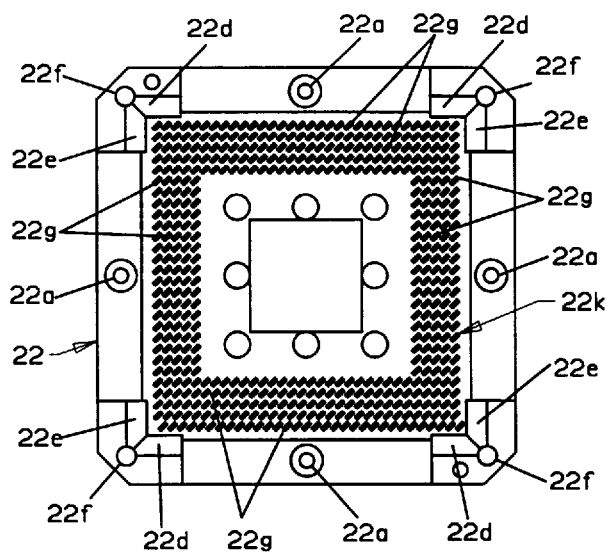
FIG. 7 is a top plan view of the adapter plate used in the FIG. 1 socket.
Figure 8:
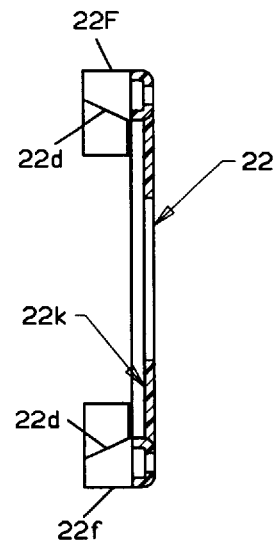
FIG. 8 is a cross sectional view taken through the FIG. 7 adapter plate.

An adapter plate 22 is also mounted for vertical movement on base 12 within opening 16a of frame member 16. A bore 22a is formed through plate 22 at a central location of each side (see FIG. 7) for reception of a respective screw 24 which is also received through an aligned bore 12d and suitably secured as by a splined nut 24a received in counterbore 12e. Heads 24b limit upward movement of adapter plate 22 by engagement with the bottom wall 22b of the adapter plate. Adapter plate 22 is biased upwardly against heads 24b of screws 24 by means of compression springs 26 which extend between adapter plate 22 and base 12. An annular groove 22c formed in the lower surface of adapter plate 22 at each corner and aligned annular grooves 12f formed in the upper surface of base 12 serve as spring seats for respective springs 26.

Adapter plate 22 is preferably provided with inclined intersecting guide surfaces 22d, 22e of guide blocks 22f at each corner on the upper surface thereof so that an IC component, when placed on adapter plate 22, will be precisely guided to an IC component seating surface 22k. An array of apertures 22g matching the array of contact points on the bottom surface of an IC component to be received in the socket for testing are formed through bottom wall 22b of the adapter plate, preferably formed with enlarged lead in tapers 22h on the bottom side of the plate (seen in FIGS. 3 and 4).

Figure 3:
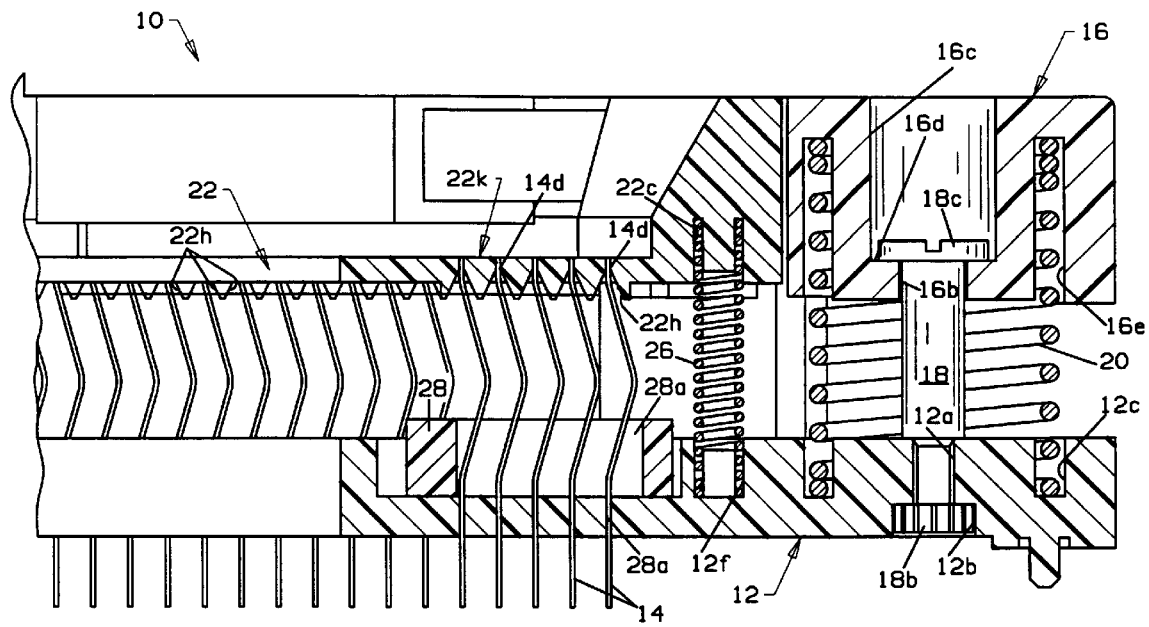
FIG. 3 is a cross sectional view taken on line 3—3 of FIG. 1.
Figure 4:
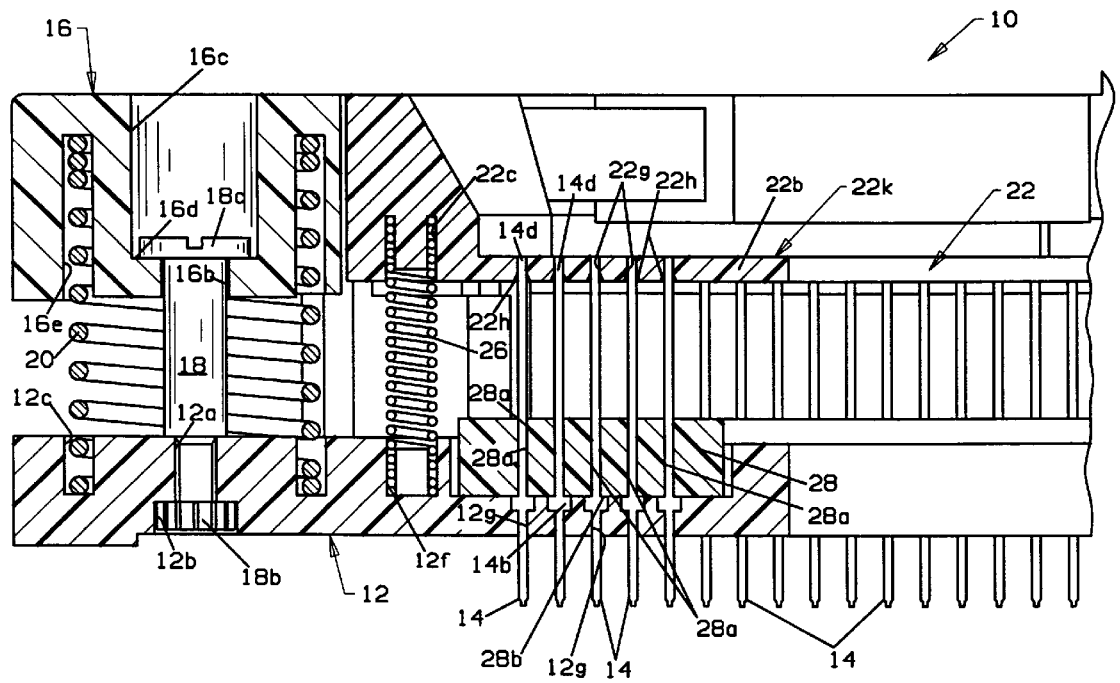
FIG. 4 is a cross sectional view taken on line 4—4 of FIG. 1.
Figure 9:
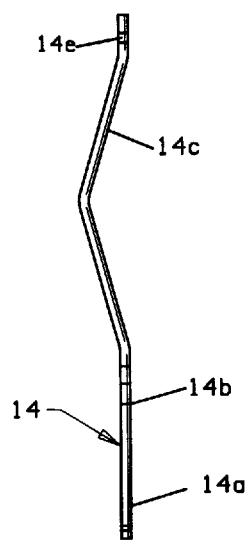
FIG. 9 is a side elevational view of one of an elongated contact element of the type used in the FIG. 1 socket.
Figure 10:
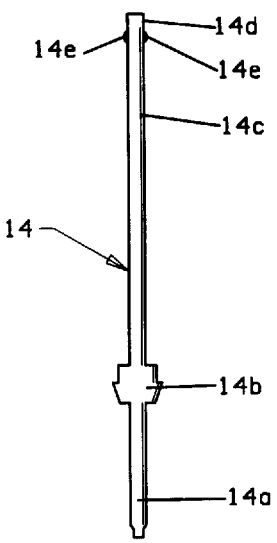
FIG. 10 is a front elevation of the FIG. 9 contact element.

Elongated contact elements 14, seen separately in FIGS. 9 and 10, formed of suitable electrically conductive material having good mechanical spring characteristics, have a lower pin portion 14a for reception in apertures of a circuit substrate, not shown, an anchor portion 14b, an elongated spring portion 14c and distal free contact portion 14d extending upwardly from tab portions 14e, the tab portions optionally provided to limit relative sliding motion of contact portion 14d through a respective aperture 22g in adapter plate 22. The pin and anchor portions 14a, 14b, are received in respective apertures 12g formed through base 12 and are fixed in place by an electrically insulative retainer 28 having corresponding aligned slots 28a. The bottom surface 28b of retainer 28, between respective slots 28a, form a stop surface by engagement with anchor portions 14b to prevent upward dislocation of the contact elements. As mentioned above, the contact portion at the outer distal end 14d of the contact elements are slidingly received in respective apertures 22g and, in the uppermost position of the adapter plate shown in FIGS. 3–5, are no higher than and preferably slightly below the top surface of bottom wall 22b.

A latch assembly 30 is preferably disposed at each side of socket 10, although, depending upon the particular array of contact points of the IC components to be tested, the latch mechanisms could be omitted on two opposites sides if desired. However, in the preferred embodiment, latch assembly 30 is provided at each of the four sides of socket 10 as seen in FIG. 1. Each latch mechanism 30 comprises a generally U-shaped lever having a latch member 30a overmolded on bight 30b with arms 30c extending to a distal end portion 30d pivotably attached to a shaft 32 with the shaft journaled in stanchion portions 12k of base 12. Each member of a pair of link members 34 has one end 34a pivotally mounted on respective pins 36 which are fixedly connected to cover frame 16. Each opposite end 34b of link members 34 is rotatably connected to end 30d of a respective arm 30c via a shaft 38 at a location spaced from shaft 32. Latch assemblies of this type are shown in U.S. Pat. No. 5,470,247, referenced above, the subject matter of which is incorporated herein by this reference.

Figure 5:
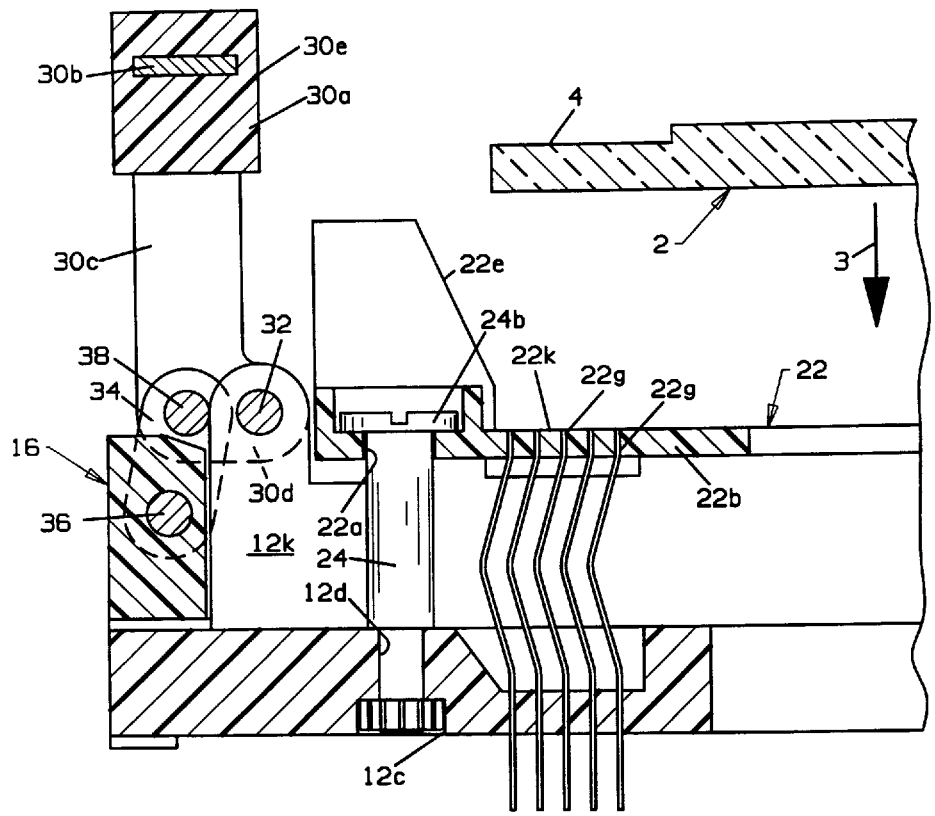
FIG. 5 is a cross sectional view similar to the left portion of FIG. 2 shown with a latch member pivoted away from the IC component seating surface and with an IC being placed in the socket.

With reference to FIG. 5, when cover frame 16 is forced downwardly to a position adjacent base 12 as seen in the drawing, its motion is transferred to the latch assemblies through link members 34 which cause arms 30c of each latch assembly to pivot about shaft 32 bringing latch member 30a to an open position with a force applying surface 30e pivoted away from the base and the adapter plate. In this position an IC component 2 may be readily inserted or loaded into the socket prior to a test, as denoted by arrow 3 in FIG. 5, or removed or unloaded from the socket after the completion of the test. Inclined guide surfaces 22d, 22e guide the IC component to a precise location on the adapter plate which serves as the IC component seating surface 22k.

Figure 6:
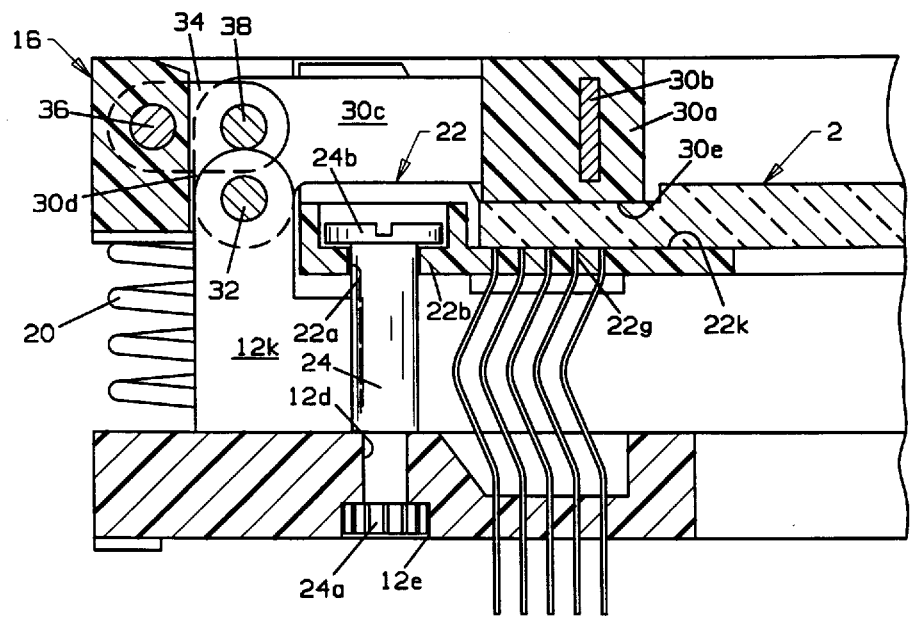
FIG. 6 is a view similar to FIG. 5 but shown with the IC component seated in the socket and with a latch member overlying the seating surface and applying a downward force to a marginal portion of the IC component.

When cover frame 16 is allowed to return to its normal, at rest position, under the influence of spring members 20, as seen in FIG. 6, the cover frame's movement is transferred to the latch assemblies through link members 34 causing latch members 30a to pivot toward the base and adapter plate 22 so that each latch member is overlying the IC component seating surface 22k. In this position, in the absence of an IC component, force applying surface 30e of each latch member is spaced from the top surface of bottom wall 22b of the adapter plate a distance less than the height of the outer marginal portion 4 of the IC component which would be received on the seating surface and aligned with the respective latch member so that, with an IC component 2 placed on seating surface 22k, force applying surface 30e transfers a force through the IC component 2 to move adapter plate 22 downwardly toward base 12 against the bias of spring members 26 to thereby expose the contact portion at the distal end of each elongated contact element 14. The respective contact points on the bottom surface of IC component 2 thereby move into engagement with the contact portion of each respective contact element 14 with a selected amount of contact force.

Thus by means of the adapter plate, which precisely positions both the IC component on the top side thereof through its guiding surfaces as well as the contact portions of each contact element of the socket through the contact apertures in the bottom wall of the adapter plate, a high degree of accuracy which is required for use with small target point contacts is obtained.

With reference to FIGS. 11–14, a modified embodiment of the invention is shown in which heat sink members are provided for placement in thermal coupling relationship with the IC components being tested. In the embodiment shown, two heat sink assemblies 40 are provided, each interconnected with two opposing latch assemblies 30 for movement therewith. Each heat sink assembly 40 comprises a pair of legs 40a each having first and second ends 40b, 40c respectively (see FIGS. 13, 14). Ends 40b are provided with first and second bores in which are received shafts 36, 38 on which link members 34 are also mounted. As a result, the position of legs 40a are fixed relative to link members 34 and are therefore movable with the link members. A respective heat sink head 42 is mounted between the second ends 40c of legs 40a by means of a pin 44 received through slot 40d in arm 40a and a compression spring 46 placed at each side between a bent over laterally extending spring seat tab portion 40e of arm 40a and heat sink head 42. Heat sink head 42 is movable between an inner position against the bias of compression springs 46 shown in FIGS. 13, 14 for purposes of illustration and an outer position (dashed line in FIG. 13) determined by a stop tab 40f formed from each end 40c bent inwardly in cooperation with a respective finger 42a of heat sink head 42.

Figure 11:
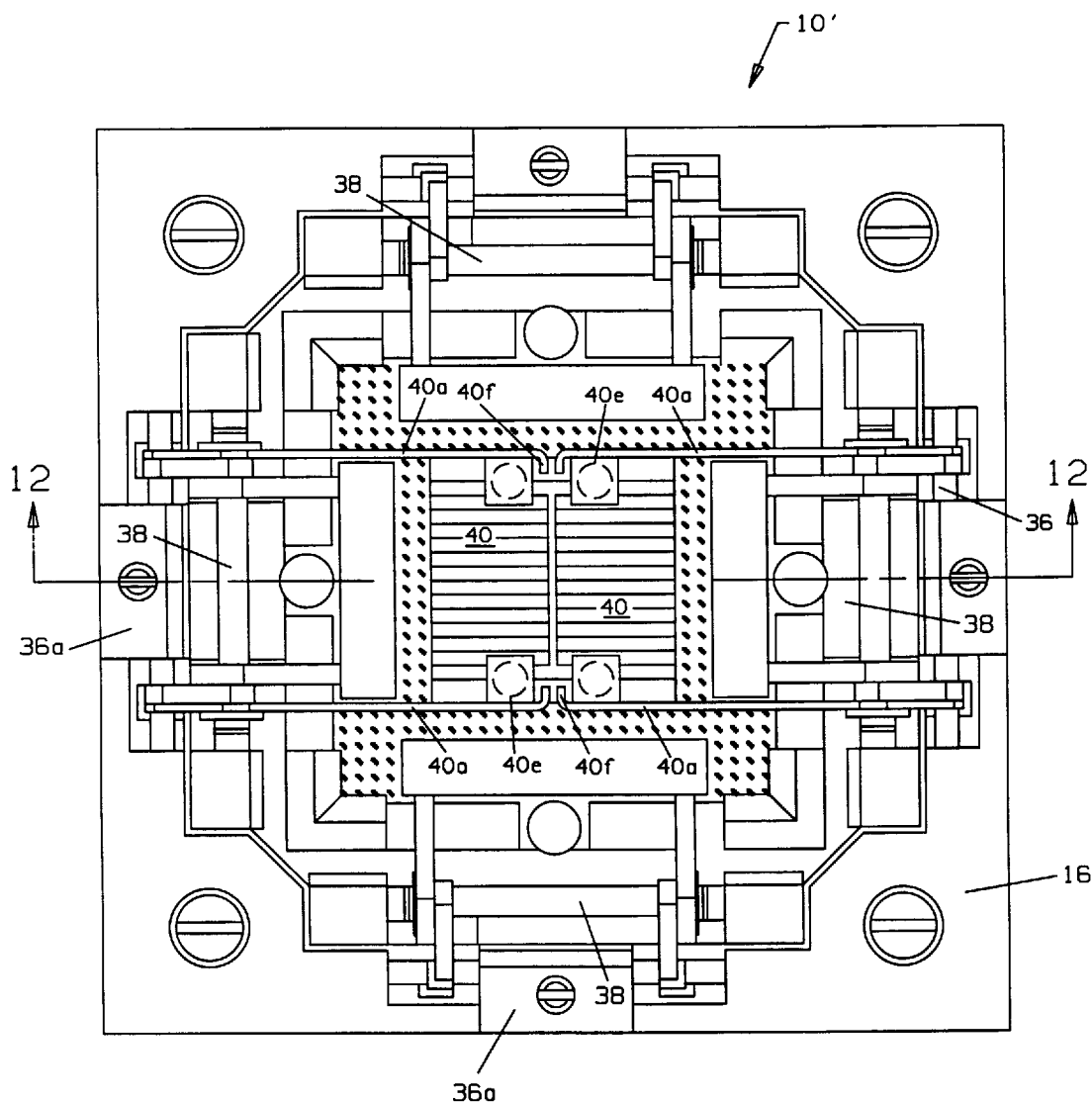
FIG. 11 is a top plan view, similar to FIG. 1, of a modified embodiment of the invention.
Figure 12:
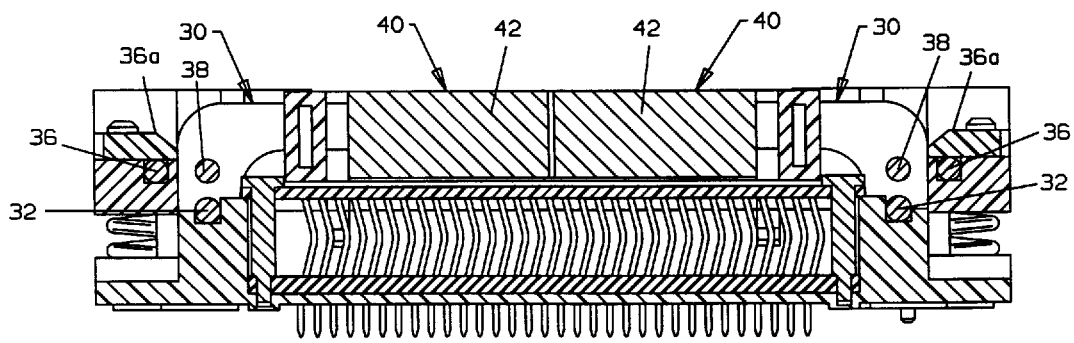
FIG. 12 is a cross sectional view taken on line 12—12 of FIG. 11.
Figure 13:
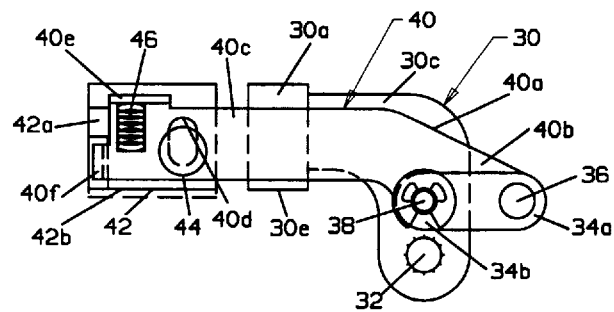
FIG. 13 is an elevational view of a latch assembly and a heat sink assembly with the latch member and heat sink member in a position overlying the adapter plate.

In the at-rest position as shown in FIGS. 11–13, each heat sink assembly 40 is disposed with heat sink head 42 overlying the seating surface 22k of the adapter plate 22 and with heat sink head 42 adapted to engage an IC component received in the socket and being biased slightly inwardly from its outer head position to conform to and be biased against the upper surface of the IC component in optimum thermal coupling therewith. That portion of surface 42b which is adapted to engage the die portion of the IC component package is preferably formed with a highly smooth surface, e.g., on the order of 16 microinch rms finish, in order to enhance thermal coupling with the IC component. Due to the pin/slot and spring arrangement the head can move between an inner and outer position as well as change its angular orientation to closely conform to the top surface of the IC component with a selected spring force. Except for retainer plate 36a, used to retain shaft 36 in cover frame 16 the remainder of socket 10' is essentially the same as in the FIGS. 1–10 embodiment and the description thereof need not be repeated.

Figure 14:
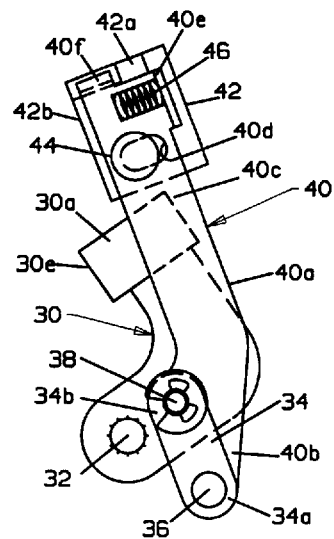
FIG. 14 is a view similar to FIG. 13 shown with the latch member and heat sink removed from the adapter plate.

When cover frame 16 is forced downwardly, as described in the FIGS. 1–10 embodiment, its motion is transferred to latch assemblies 30 through link members 34 causing each latch assembly to pivot about shaft 32 bringing latch member 30a to an open position with force applying surface pivoted away from the base and the adapter plate and with each heat sink assembly 40 pivoting away from the adapter plate into the position shown in FIG. 14. By mounting ends 40b of legs 40a on shafts 36, 38, the heat sink assemblies move effectively as an extension of link members 34 which results in the legs rotating through a larger angle than that of the latch assemblies so that heat sink heads 42 will not encroach upon the IC component loading/unloading window formed by the latch assemblies to any appreciable extent.

Although heat sink assemblies are shown with two opposing latch assemblies and not with two other opposing latch assemblies, it is within the purview of the invention to mount a separate assembly with each latch assembly, if desired.

In view of the above, it will be seen that the several objects of the invention are achieved and other advantageous results obtained.

As various changes could be made in the above constructions without departing from the scope of the invention, it is intended that all matter included in the above description or shown in the accompanying drawings can be interpreted as illustrative and not in a limiting sense.

What is claimed:

1. Socket apparatus particularly adapted for use of burn-in tests of integrated circuit (IC) components having a large number of contact points on a surface thereof comprising, a base, an adapter plate movably mounted on the base, spring members biasing the adapter plate away from the base toward an uppermost position, the adapter plate having a plurality of contact element receiving apertures therethrough within an IC seating surface, at least one latch assembly mounted on the base, the latch assembly having a latch member movable between a first position overlying the adapter plate and a second position removed from the adapter plate, an actuator for moving the at least one latch assembly between the first and second positions, at least one heat sink assembly movable from an operative position overlying the adapter plate and an IC loading/unloading position removed from the adapter plate, the at least one heat sink assembly being movable with the at least one latch assembly, a plurality of contact elements mounted in the base, the contact elements each having a pin portion extending through the base for connection to a circuit board and a contact portion having a distal end received in the respective contact element receiving aperture of the adapter plate with the distal end of the contact portions positioned just below a top surface of the adapter plate when the adapter plate is in its uppermost position, the latch member, when in the first position in the absence of the IC component, being spaced from the adapter plate a distance less than a thickness of a portion of the IC component which would be aligned with the latch member if the IC component were placed on the IC seating surface so that when the IC component is received on the IC seating surface and the latch member moves to the first position, the adapter plate will be pushed downwardly against the bias of the spring members to expose the contact portions of the contact elements causing the contact portions to engage the contact points of the IC component and with the at least one heat sink assembly engaging the IC component.

2. Socket apparatus according to claim 1 in which the base has four sides and the at least one latch assembly and the at least one heat sink assembly are mounted on the base at at least two of the sides.

3. Socket apparatus according to claim 1 in which each said latch assembly comprises a generally U-shaped lever having a bight and a pair of arms extending from the bight to a respective free distal end, the latch member being disposed on the bight and the free distal end of the arms pivotably mounted to the base, a pair of link members each having first and second ends, the first end of each said link member rotatably connected to the respective arm at a location spaced from pivotable mounting, the second end of each said link member rotatably connected to the actuator movably mounted on the base between upper and lower positions with the latch member in the first position overlying the adapter plate when the actuator is in the upper position and in the second position removed from the adapter plate when the actuator is in the lower position, each said heat sink assembly comprises a pair of legs having first and second ends, the first end of each said leg being attached to the respective link member to move as an extension of the respective link and the second end of each said leg connected to a heat sink member, the heat sink member disposed in overlying relation to the adapter plate in the first position of the latch member and removed from the adapter plate in the second position of the latch member.

4. Socket apparatus according to claim 3 in which the heat sink member is movably attached between inner and outer positions at the second end of each said leg and a spring member biases the heat sink member toward the outer position so that when the latch member is in the first position the heat sink member engages the IC component disposed on the IC seating surface and is biased toward the inner position with a selected spring force for optimum heat coupling with the IC component.

5. Socket apparatus according to claim 3 in which the one end of each said leg of the heat sink assembly is attached to the first and second ends of the respective link.

6. Socket apparatus according to claim 3 in which the actuator comprises a cover.

7. Socket apparatus according to claim 6 in which the cover is in the form of a frame forming an opening therethrough and the cover is mounted for vertical movement toward and away from the base and further comprising cover spring members mounted on the base urging the cover away from the base.

8. Socket apparatus according to claim 1 further including guide surfaces mounted in the socket to guide the IC component to a selected location on the adapter plate.

9. Socket apparatus according to claim 8 in which the guide surfaces are integrally formed on the adapter plate.

10. Socket apparatus comprising a base, a cover frame movably mounted on the base in a direction toward and away from the base between a first at-rest position removed from the base and a second actuated position adjacent to the base, spring means biasing the cover frame toward the first position, a latch assembly including a latch member having a force applying surface, the latch member pivotably mounted on the base and connected by a link to the cover frame and being movable between a first closed position with the force applying surface overlying the base when the cover frame is in the first at-rest position and a second open position with the force applying surface pivoted away from the base when the cover frame is in the second actuated position, a heat sink assembly movable from an operational position overlying the adapter plate when the latch member is in the first position and an integrated circuit (IC) component loading/unloading position removed from the adapter plate when the latch member is in the second position, the heat sink assembly being attached to the latch assembly and being movable with the link connecting the latch member and the cover frame, an adapter plate movably mounted on and movable toward and away from the base, spring means mounted on the base placing a force on the adapter plate in a direction away from the base, the IC component seating surface formed on a top surface of the adapter plate, a plurality of contact receiving apertures formed through the adapter plate in a selected pattern aligned with the IC component seating surface, a plurality of elongated contact elements each having a portion anchored in the base and a distal free end portion received in a respective contact aperture of the adapter plate, the adapter plate exposing the distal free end portions of the contact elements when the adapter plate is moved toward the base, the force applying surface of the latch member, when in the closed position, being aligned with the seating surface and, in the absence of the IC component, spaced from the adapter plate a distance less than the thickness of a marginal portion of the IC component so that when the cover frame is in the second actuated position and the IC component is placed on a lower surface thereof, the latch member will place a force on the marginal portion of the IC component when the cover frame moves back to the first at-rest position and the latch member moves to the closed position causing the adapter plate to move downwardly with the distal end of each contact element coming into engagement with a respective contact area of the IC component disposed on the IC component seating surface.

11. Socket apparatus comprising a base, an integrated circuit (IC) component seating surface cover frame movably mounted on the base vertically between a first at-rest position removed from the base and a second actuated position adjacent to the base, spring means biasing the cover frame toward the first position, a latch assembly including a latch member having a force applying surface, the latch member pivotably mounted on the base and connected by at least one link to the cover frame and being movable between a first closed position with the force applying surface overlying the base when the cover frame is in the first at-rest position and a second open position with the force applying surface pivoted away from the base when the cover frame is in the second actuated position, and a heat sink assembly movable from an operational position overlying the IC component seating surface and an IC component loading/unloading position removed from the IC component seating surface, the heat sink assembly being attached to and movable with the latch assembly.

12. Socket apparatus according to claim 11 in which the link has first and second ends and the heat sink assembly is connected to the first and second ends of the link to move effectively as an extension of the link.

13. Socket apparatus according to claim 11 in which the latch assembly comprises a generally U-shaped lever having a bight and a pair of arms extending from the bight to a respective free distal end, the latch member being disposed on the bight and the free distal end of the arms pivotably mounted to the base, a pair of links each having first and second ends, the first end of each said link rotatably connected to the respective arm at a location spaced from the pivotable mounting, the second end of each said link rotatably connected to the cover frame movably mounted on the base between the first and second positions with the latch member in a first position overlying the IC component seating surface when the cover is in the first position and in a second position removed from the IC component seating surface when the cover is in the second position, the heat sink assembly comprises a pair of legs having first and second ends, the first end of each said leg fixedly attached to a respective link and the second end of each said leg connected to a heat sink member, the heat sink member disposed in overlying relation to the IC component seating surface in the first position of the latch member and removed from the IC component seating surface in the second position of the latch member.

14. Socket apparatus according to claim 13 in which the heat sink member is movably attached between inner and outer positions at the second end of each said leg and a spring member biases the heat sink member toward the outer position so that when the latch member is in the first position the heat sink member engages an IC component disposed on the IC component seating surface and is biased toward the inner position with a selected spring force for optimum heat coupling with the IC component.

* * * * *

UNITED STATES PATENT AND TRADEMARK OFFICE
CERTIFICATE OF CORRECTION

PATENT NO. : 5,865,639
DATED : February 2, 1999
INVENTOR(S) : Masahiro Fuchigami and Salvatore P. Rizzo It is certified that error appears in the above-identified patent and that said Letters Patent is hereby corrected as shown below:

Claim 11 should read as follows:

11. Socket apparatus comprising a base, an integrated circuit (IC) component seating surface, a cover frame movably mounted on the base vertically between a first at-rest position removed from the base and a second actuated position adjacent to the base, spring means biasing the cover frame toward the first position, a latch assembly including a latch member having a force applying surface, the latch member privotably mounted on the base and connected by a least one link to the cover frame and being movable between a first closed position with the force applying surface overlying the base when the cover frame is in the first at-rest position and a second open position with the force applying surface pivoted away from the base when the cover frame is in the second actuated position, and a heat sink assembly movable from an operational position overlying the IC component seating surface and an IC component loading/unloading position removed from the IC component seating

UNITED STATES PATENT AND TRADEMARK OFFICE
CERTIFICATE OF CORRECTION

PATENT NO. : 5,865,639
DATED : February 2, 1999
INVENTOR(S) : Masahiro Fuchigami and Salvatore P. Rizzo It is certified that error appears in the above-identified patent and that said Letters Patent is hereby corrected as shown below:

surface, the heat sink assembly being attached to and movable with the latch assembly.

Signed and Sealed this

Tenth Day of August, 1999

*Attest:*

Q. TODD DICKINSON

*Attesting Officer*     Acting Commissioner of Patents and Trademarks